United States Patent
Li et al.

(10) Patent No.: US 10,593,279 B2
(45) Date of Patent: Mar. 17, 2020

(54) DISPLAY DEVICE, GATE DRIVING CIRCUIT AND GATE DRIVING UNIT

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Meng Li, Beijing (CN); Yongqian Li, Beijing (CN); Pan Xu, Beijing (CN); Zhenfei Cai, Beijing (CN); Zhidong Yuan, Beijing (CN); Can Yuan, Beijing (CN); Xuehuan Feng, Beijing (CN); Wenchao Bao, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 177 days.

(21) Appl. No.: 15/821,149

(22) Filed: Nov. 22, 2017

(65) Prior Publication Data
US 2018/0301100 A1    Oct. 18, 2018

(30) Foreign Application Priority Data
Apr. 12, 2017   (CN) .......................... 2017 1 0236226

(51) Int. Cl.
*G11C 19/00* (2006.01)
*G09G 3/36* (2006.01)
*G11C 19/28* (2006.01)

(52) U.S. Cl.
CPC ......... *G09G 3/3674* (2013.01); *G09G 3/3677* (2013.01); *G09G 2310/0286* (2013.01); *G09G 2310/061* (2013.01); *G11C 19/28* (2013.01)

(58) Field of Classification Search
None
See application file for complete search history.

(56) References Cited

U.S. PATENT DOCUMENTS 6,426,743 B1 * 7/2002 Yeo ...................... G09G 3/3677
                                                        345/100
7,760,846 B2 * 7/2010 Peng ...................... G11C 19/28
                                                        377/64
(Continued)

FOREIGN PATENT DOCUMENTS

CN       105489153 A     4/2016
CN       106297619 A     1/2017

OTHER PUBLICATIONS

Second Chinese Office Action dated Apr. 24, 2019, received for corresponding Chinese Application No. 201710236226.5.

*Primary Examiner* — Tuan T Lam
(74) *Attorney, Agent, or Firm* — Kinney & Lange, P.A.

(57) ABSTRACT

A display device, a gate driving circuit and a gate driving unit are provided. The gate driving unit includes: a signal maintenance circuit configured to, in the case that a first clock signal at a high level is received, output a high level in accordance with an inputted trigger signal at a high level; a first-level output circuit configured to, in the case that a second clock signal at a high level is received, output a first-level driving signal at a high level in accordance with the high level from an output end of the signal maintenance circuit; and a second-level output circuit configured to, in the case that a third clock signal at a high level is received, output a second-level driving signal at a high level in accordance with the high level from an output end of the first-level output circuit.

20 Claims, 6 Drawing Sheets

(56) References Cited

U.S. PATENT DOCUMENTS

| | | | | |
|---|---|---|---|---|
| 8,019,039 B1* | 9/2011 | Tsai | ................ | G11C 19/28 |
| | | | | 377/64 |
| 8,929,506 B2* | 1/2015 | Ma | ................ | G11C 19/28 |
| | | | | 377/64 |
| 9,269,289 B2* | 2/2016 | Gao | ................ | G11C 19/28 |
| 10,176,741 B2* | 1/2019 | Chen | ................ | G09G 3/20 |
| 2007/0297559 A1* | 12/2007 | Cho | ................ | G09G 3/3677 |
| | | | | 377/64 |
| 2008/0062071 A1* | 3/2008 | Jeong | ................ | G11C 19/184 |
| | | | | 345/46 |
| 2010/0171689 A1* | 7/2010 | Jeong | ................ | G11C 19/18 |
| | | | | 345/100 |
| 2012/0188210 A1* | 7/2012 | Zhang | ................ | G09G 3/3677 |
| | | | | 345/204 |
| 2017/0365221 A1* | 12/2017 | Chung | ................ | G09G 3/3208 |
| 2018/0336857 A1* | 11/2018 | Shi | ................ | G09G 3/3674 |

* cited by examiner

DISPLAY DEVICE, GATE DRIVING CIRCUIT AND GATE DRIVING UNIT

CROSS-REFERENCE TO RELATED APPLICATION

The present application claims a priority of the Chinese patent application No. 201710236226.5 filed on Apr. 12, 2017, which is incorporated herein by reference in its entirety.

TECHNICAL FIELD

The present disclosure relates to the field of gate driving technology, in particular to a display device, a gate driving circuit and a gate driving unit.

BACKGROUND

Currently, liquid crystal display devices have been widely used in our lives. In order to achieve a high resolution and a narrow bezel, usually a Gate Driver on Array (GOA) technique is adopted in the liquid crystal display devices. As an important member for the GOA technique, a gate driving circuit may include a plurality of gate driving units (also called as shift register units) connected in a cascaded manner, and each gate driving unit may be connected to one gate line so as to apply a signal thereto, thereby to scan pixels progressively.

For most of the gate driving units in related art, one trigger signal is merely used to trigger one shift register signal. In other words, in the related art, the gate driving unit merely outputs one gate driving signal, so as to drive the pixels in one row. In this regard, the entire gate driving circuit includes a large number of gate driving units, and a large area is occupied thereby, so it is adverse to the miniaturization and the low cost of a display panel.

SUMMARY

An object of the present disclosure is to provide a display device, a gate driving circuit and a gate driving unit, so as to reduce the number of the gate driving units for the display device, simplify a cascading relationship among the gate driving units and save the space for cascaded lines, thereby to facilitate the miniaturization and the low cost of the display device.

In one aspect, the present disclosure provides in some embodiments a gate driving unit, including: a signal maintenance circuit which is configured to, during a period that a first clock signal input end of the signal maintenance circuit receives a first clock signal at a high level, output a high level from an output end of the signal maintenance circuit in accordance with a trigger signal at a high level inputted into a trigger signal input end of the signal maintenance circuit; a first-level output circuit, wherein a trigger signal input end of the first-level output circuit is connected to the output end of the signal maintenance circuit, and the first-level output circuit is configured to, during a period that a second clock signal input end of first-level output circuit receives a second clock signal at a high level, output a first-level driving signal at a high level from an output end of the first-level output circuit in accordance with the high level from the output end of the signal maintenance circuit; and a second-level output circuit, wherein a trigger signal input end of the second-level output circuit is connected to the output end of the first-level output circuit, and the second-level output circuit is configured to, during a period that a third clock signal input end of the second-level output circuit receives a third clock signal at a high level, output a second-level driving signal at a high level from an output end of the second-level output circuit in accordance with the high level from the output end of the first-level output circuit, wherein the second clock signal at the high level arrives upon the first clock signal at the high level ends, and the third clock signal at the high level arrives upon the second clock signal at the high level ends.

In a possible embodiment of the present disclosure, each of the signal maintenance circuit, the first-level output circuit and the second-level output circuit further comprises a respective resetting signal input end and is configured to, in the case that the respective resetting signal input end receives a resetting signal, reset the respective output end to be at a low level.

In a possible embodiment of the present disclosure, the resetting signal input end of the signal maintenance circuit receives a first resetting signal, and the signal maintenance circuit is configured to reset the output end of the signal maintenance circuit in accordance with the first resetting signal; the resetting signal input end of the first-level output circuit is connected to the signal maintenance circuit, and the output end of the first-level output circuit is capable of being reset under the control of the first resetting signal; and the resetting signal input end of the second-level output circuit receives a second resetting signal, and the second resetting signal is the first clock signal.

In a possible embodiment of the present disclosure, the signal maintenance circuit comprises a high-level maintenance sub-circuit and a level pull-down sub-circuit; the high-level maintenance sub-circuit is configured to, during the period that the first clock signal is at the high level, output the high level from the output end of the signal maintenance circuit in accordance with the inputted trigger signal at the high level; the level pull-down sub-circuit is configured to, during the period that the first clock signal is at the high level, enable the high-level maintenance sub-circuit to be electrically disconnected from a low reference voltage end VGL, and upon the first resetting signal at the high level arrives, enable the high-level maintenance sub-circuit to be electrically connected to the low reference voltage end VGL, to reset the output end of the signal maintenance circuit to be at a low level; and the first resetting signal arrives upon the second clock signal at the high level ends.

In a possible embodiment of the present disclosure, the high-level maintenance sub-circuit comprises a first transistor, a second transistor and a third transistor; a drain electrode of the first transistor is connected to a trigger signal input end of the gate driving unit, a gate electrode of the first transistor and a gate electrode of the second transistor are connected to the first clock signal input end, a source electrode of the first transistor is connected to a drain electrode of the second transistor and a drain electrode of the third transistor, a source electrode of the third transistor is connected to the second clock signal input end, and a first node connecting a gate electrode of the third transistor and a source electrode of the second transistor serves as the output end of the signal maintenance circuit; and the level pull-down sub-circuit is further configured to, during the period that the first clock signal is at the high level, enable the first node to be electrically disconnected from the low reference voltage end VGL, and upon the second clock signal at the high level ends, enable the first node to be electrically connected to the low reference voltage end VGL, to pull down a level at the first node.

In a possible embodiment of the present disclosure, the level pull-down sub-circuit comprises a tenth transistor, an eleventh transistor, a twelfth transistor, and a thirteenth transistor; and a gate electrode of the tenth transistor, a gate electrode of the eleventh transistor, a source electrode of the twelfth transistor and a drain electrode of the thirteenth transistor are connected to a second node, a drain electrode of the tenth transistor and a gate electrode of the thirteenth transistor are connected to the first node, a source electrode of the tenth transistor and a drain electrode of the eleventh transistor are connected to the drain electrode of the third transistor, a source electrode of the eleventh transistor is connected to the low reference voltage end VGL, a drain electrode of the twelfth transistor is connected to a high reference voltage end VGH, and a gate electrode of the twelfth transistor is connected to the resetting signal input end of the signal maintenance circuit.

In a possible embodiment of the present disclosure, the first-level output circuit comprises a fourth transistor, a fifth transistor, a sixth transistor, a seventh transistor, a first capacitor and a second capacitor; and a gate electrode of the fourth transistor is connected to the trigger signal input end of the first-level output circuit and the first node, a drain electrode of the fourth transistor is connected to the second clock signal input end, a source electrode of the fourth transistor is connected to a drain electrode of the fifth transistor and a gate electrode of the sixth transistor, a node connecting a gate electrode of the fifth transistor and a gate electrode of the seventh transistor is connected to the second node and serves as the resetting signal input end of the first-level output circuit, a source electrode of the fifth transistor and a source electrode of the seventh transistor are connected to the low reference voltage end VGL, a drain electrode of the sixth transistor is connected to a circuit operating voltage end VDD, the first capacitor is connected to the gate electrode and the source electrode of the fourth transistor, the second capacitor is connected to the gate electrode and a source electrode of the sixth transistor, and a third node connecting a drain electrode of the seventh transistor and the source electrode of the sixth transistor serves as the output end of the first-level output circuit.

In a possible embodiment of the present disclosure, the second-level output circuit comprises an eighth transistor, a ninth transistor, a fourteenth transistor, a fifteenth transistor, a sixteenth transistor and a third capacitor; and a gate electrode of the fourteenth transistor is connected to a gate electrode of the sixth transistor, a drain electrode of the fourteenth transistor is connected to the trigger signal input end of the second-level output circuit and the third node, a source electrode of the fourteenth transistor is connected to a drain electrode of the fifteenth transistor and a drain electrode of the sixteenth transistor, a source electrode of the fifteenth transistor is connected to a gate electrode of the eighth transistor, a drain electrode of the eighth transistor is connected to the circuit operating voltage end VDD, a source electrode of the ninth transistor and a source electrode of the sixteenth transistor are connected to the low reference voltage end VGL, a node connecting a gate electrode of the ninth transistor and a gate electrode of the sixteenth transistor is connected to the first clock signal input end and serves as the resetting signal input end of the second-level output circuit, a gate electrode of the fifteenth transistor is connected to the third clock signal input end, the third capacitor is connected to the gate electrode and a source electrode of the eighth transistor, and a fourth node connecting the source electrode of the eighth transistor and a drain electrode of the ninth transistor serves as the output end of the second-level output circuit.

In another aspect, the present disclosure provides in some embodiments a gate driving circuit includes at least two of the above-mentioned gate driving units connected in a cascaded manner. A second-level driving signal outputted from a current-level gate driving unit serves as a trigger signal inputted to a next-level gate driving unit.

In yet another aspect, the present disclosure provides in some embodiments a display device including the above-mentioned gate driving circuit.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
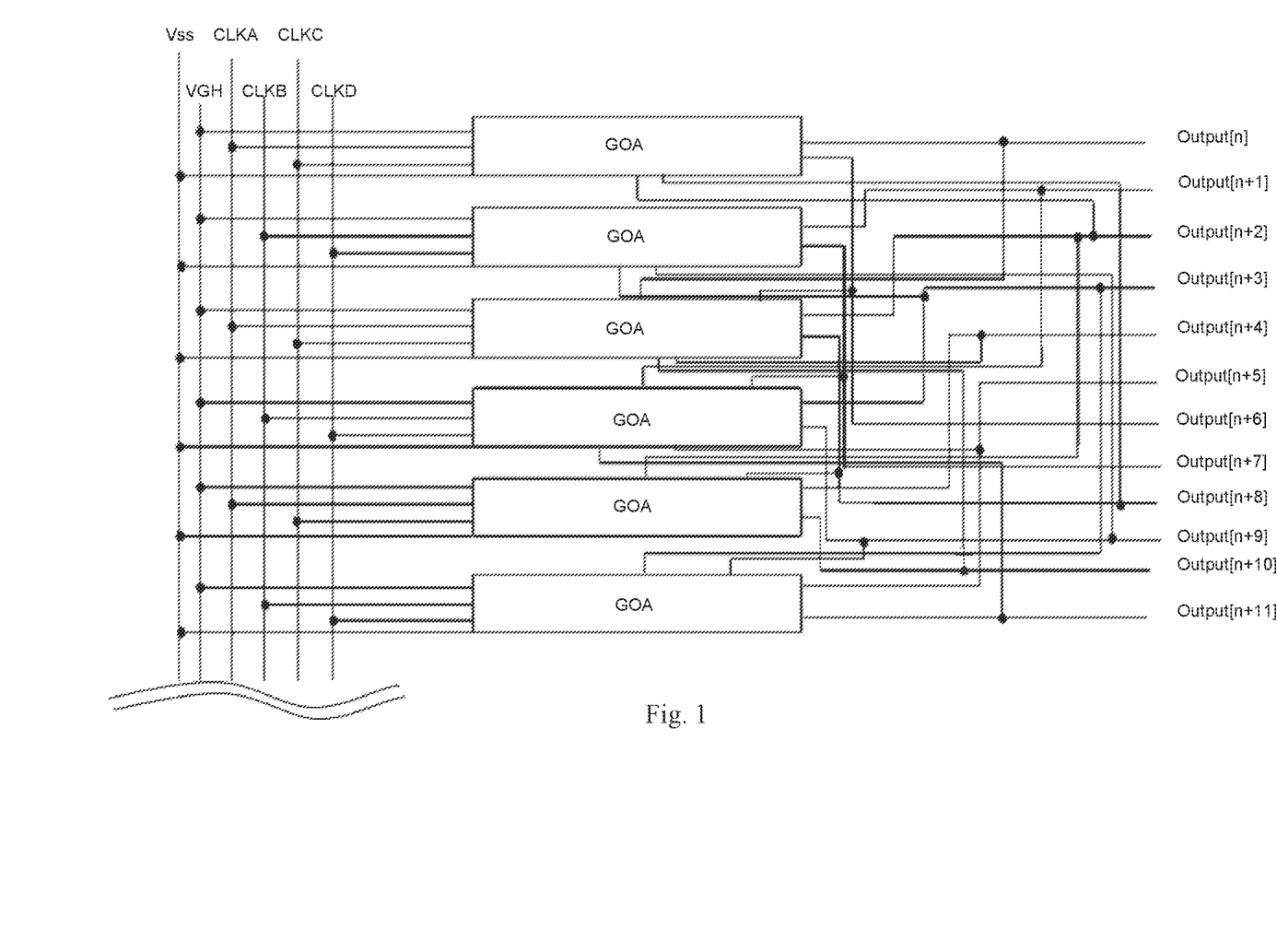
FIG. 1 is a schematic view showing a plurality of gate driving units connected in a cascaded manner in the related art.

For a gate driving unit in the related art, one trigger signal may be used to trigger two shift register signals, so as to reduce the number of the gate driving units for a display device. However, the wiring of cascaded circuits for the gate driving unit is very complex. In such gate driving unit, as shown in FIG. 1, an $n^{th}$ gate driving unit (GOA unit) may output two gate driving signals, i.e., Output[n] and Output[n+6], but two gate driving signals, i.e., Output[n+8] and Output[n+2], from the other GOA units need to be received by the $n^{th}$ GOA unit as resetting signals, so the cascading relationship thereof is very complex, and a large space may be occupied by the wiring. Hence, due to the large space for the cascaded lines, a gate driving circuit including the gate driving units still needs to occupy a large area, and it is adverse to the miniaturization of the display device.

For a gate driving unit in the embodiments of the present disclosure, a signal maintenance circuit arranged in front of a first-level output circuit may output a driving signal at a high level in accordance with a trigger signal in the case that a first clock signal at a high level is received, maintain the driving signal and output it to a first-level output circuit in the case that a second clock signal at a high level is received. Two output circuits connected in a cascaded manner, i.e., the first-level output circuit and a second-level output circuit, may output driving signals at a high level respectively in the case that the second clock signal and a third clock signal each at a high level are received. In this way, it is able to trigger the output of two shift register signals through one trigger signal. In other words, after the gate driving unit has received one trigger signal, it is able to trigger two gate driving signals. As a result, it is able to reduce the number of the gate driving units in a display device in the case that an identical number of rows of pixels need to be driven.

In addition, the driving signal from the first-level output circuit is delayed by one clock signal with respect to the trigger signal, and the driving signal from the second-level output circuit is delayed by one clock signal with respect to the driving signal from the first-level output circuit. Hence, the driving signal from the second-level output circuit may be directly used as a trigger signal for a next-level gate driving unit, so as to trigger the output of two driving signals from the next-level gate driving unit. The cascading relationship thereof and the wiring between the cascaded gate driving units are very simple, so it is able to save the wiring space, thereby to achieve the miniaturization and low cost of the display device.

The present disclosure will be described hereinafter in more details in conjunction with the drawings and embodiments.

Figure 2:
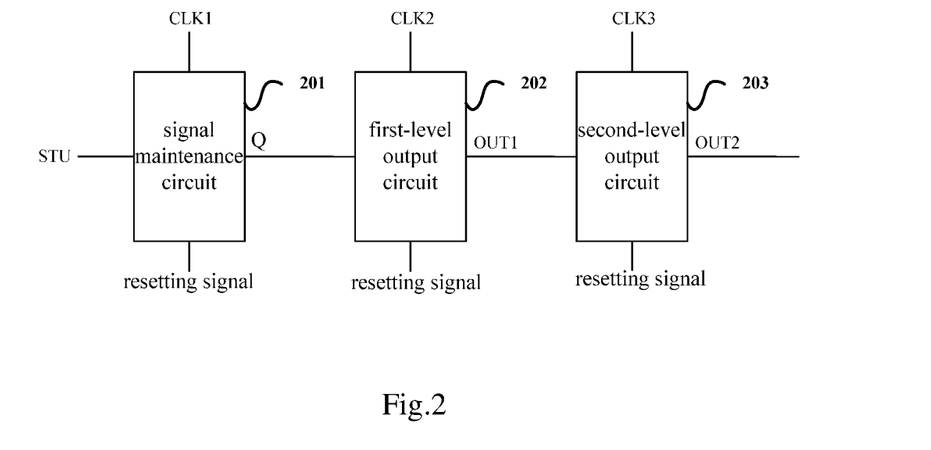
FIG. 2 is a schematic view showing a gate driving unit according to one embodiment of the present disclosure.

The present disclosure provides in some embodiments a gate driving unit which, as shown in FIG. 2, includes a signal maintenance circuit 201, a first-level output circuit 202 and a second-level output circuit 203.

The signal maintenance circuit 201 at least includes a first clock signal input end, a trigger signal input end, and an output end. The first clock signal input end and the trigger signal input end of the signal maintenance circuit 201 serve as a first clock signal input end and a trigger signal input end of the gate driving unit respectively.

The signal maintenance circuit 201 is configured to, in the case that the first clock signal input end receives a first clock signal CLK1 at a high level, output a high level from the output end (node Q) in accordance with a trigger signal STU at a high level from the trigger signal input end.

The signal maintenance circuit 201 may further include a resetting signal input end, and the signal maintenance circuit 201 may be further configured to, in the case that the resetting signal input end receives a resetting signal, reset the output end to be at a low level.

The first-level output circuit 202 at least includes a second clock signal input end, a trigger signal input end, and an output end. The second clock signal input end and the output end of the first-level output circuit 202 serve as a second clock signal input end and a first-level driving signal output end OUT1 of the gate driving unit. The trigger signal input end of the first-level output circuit 202 is connected to the output end of the signal maintenance circuit 201.

The first-level output circuit 202 is configured to, in the case that the second clock signal input end receives a second clock signal CLK2 at a high level, output the first-level driving signal at a high level from the output end OUT1 of the first-level output circuit 202 in accordance with a high level from the output end (node Q) of the signal maintenance circuit 201.

The first-level output circuit 202 may further include a resetting signal input end, and the first-level output circuit 202 may be further configured to, in the case that the resetting signal input end receives the resetting signal, reset its output end to be at a low level.

The second-level output circuit 203 at least includes a third clock signal input end, a trigger signal input end and an output end. The third clock signal input end and the output end of the second-level output circuit 203 serve as a third clock signal input end and a second-level driving signal output end OUT2 of the gate driving unit respectively, and the trigger signal input end of the second-level output circuit 203 is connected to the output end of the first-level output circuit 202.

The second-level output circuit 203 is configured to, in the case that the third clock signal input end receives a third clock signal CLK3 at a high level, outputs a second-level driving signal at a high level from the output end OUT2 of the second-level output circuit in accordance with the high level from the output end of the first-level output circuit 202.

The second-level output circuit 203 may further include a resetting signal input end, and the second-level output circuit 203 may be further configured to, in the case that the resetting signal input end receives a resetting signal, reset its output end to be at a low level. In other words, each of the signal maintenance circuit, the first-level output circuit and the second-level output circuit further includes the respective resetting signal input end, and configured to reset the respective output end to be at a low level in the case that the respective resetting signal input end receives the resetting signal.

In a possible embodiment of the present disclosure, the resetting signal input end of the signal maintenance circuit 201 serves as a resetting signal input end of the gate driving unit and receives a first resetting signal XK, and the signal maintenance circuit 201 is configured to resets the output end in accordance with the first resetting signal. The resetting signal input end of the first-level output circuit 202 is connected to the signal maintenance circuit 201, and the output end of the first-level output circuit is reset under the control of the first resetting signal. In other words, both the output end of the first-level output circuit 202 and the output end of the signal maintenance circuit 201 are reset in accordance with the first resetting signal XK.

The first clock signal may be used by the second-level output circuit 203 as the resetting signal. In other words, the resetting signal input end of the second-level output circuit may receive the first clock signal as the second resetting signal, and the output end of the second-level output circuit may be reset in accordance with the first clock signal.

Figure 3:
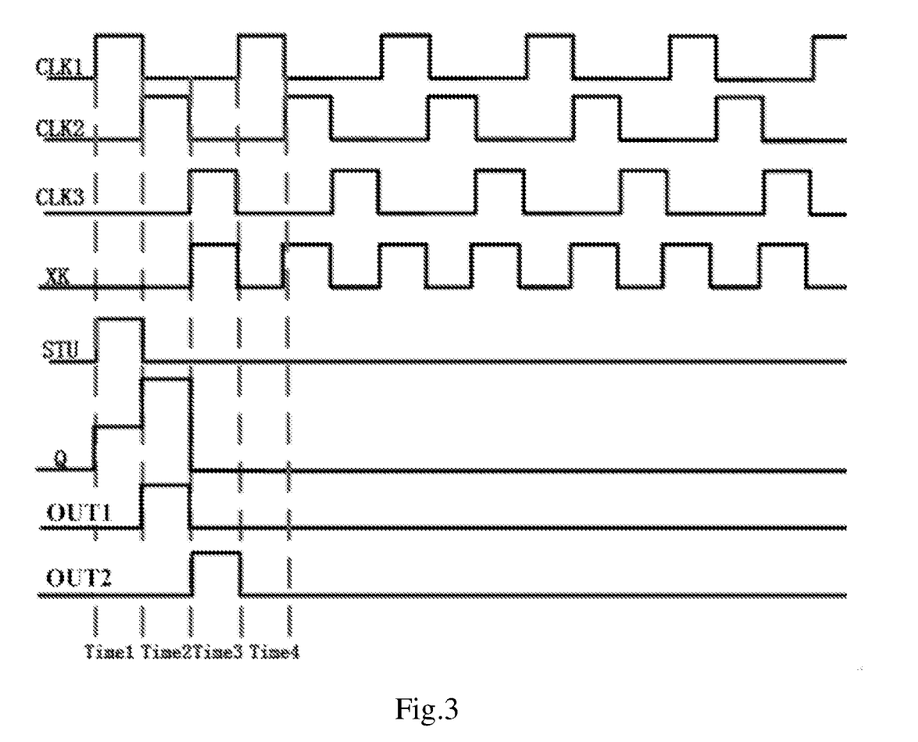
FIG. 3 is a sequence diagram of output signals and input signals for the gate driving unit according to one embodiment of the present disclosure.

The first clock signal CLK1 at a high level and the trigger signal STU at a high level arrives at the same time, the second clock signal CLK2 at a high level arrives after the first clock signal CLK1 at a high level, the third clock signal CLK3 at a high level arrives after the second clock signal CLK2 at a high level, the first resetting signal XK at a high level arrives after the second clock signal CLK2 at a high level, and the first clock signal CLK1 at a high level arrives again after the third clock signal CLK3 at a high level.

FIG. 3 is a sequence diagram of the trigger signal STU, the clock signals CLK1, CLK2 and CLK3, the first resetting signal XK, and the signals from the output ends OUT1 and OUT2 of the gate driving units.

Figure 4:
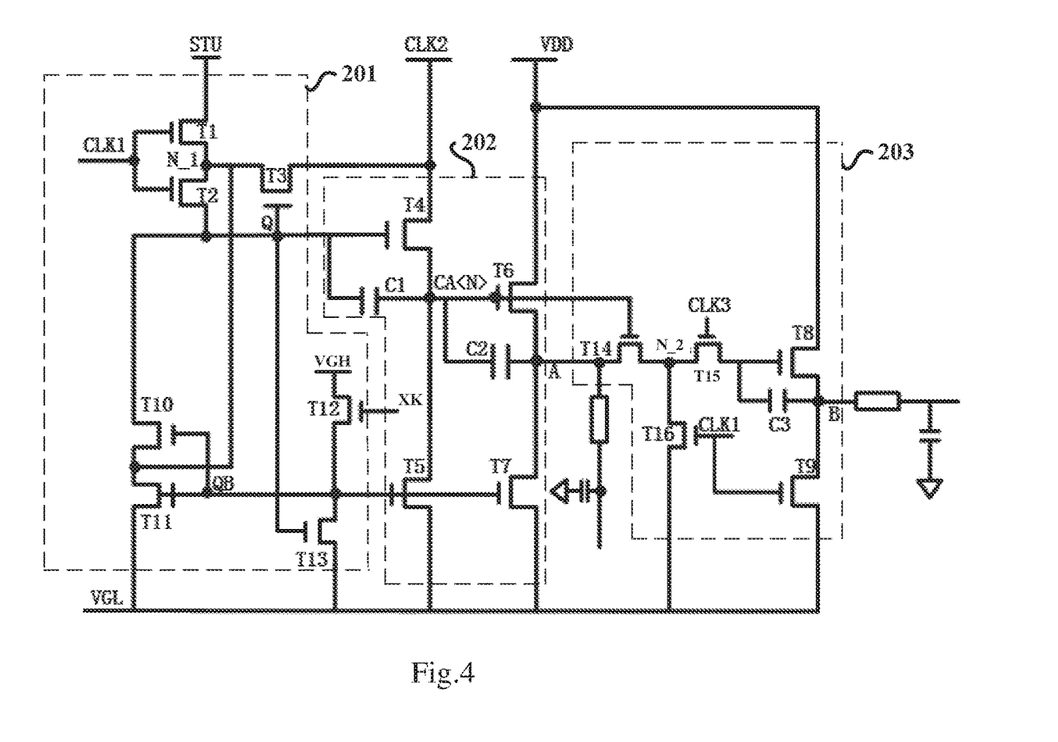
FIG. 4 is a circuit diagram of the gate driving unit according to one embodiment of the present disclosure.

FIG. 4 is a circuit diagram of the gate driving unit in the embodiments of the present disclosure. The signal maintenance circuit 201 may include a high-level maintenance sub-circuit and a level pull-down sub-circuit. The high-level maintenance sub-circuit is configured to, in the case that the first clock signal at a high level is received, enable the output end of the signal maintenance circuit to output a high level in accordance with the inputted trigger signal at a high level. The level pull-down sub-circuit is configured to, in the case that the first clock signal at a high level is received, enable the high-level maintenance sub-circuit to be electrically disconnected from a low reference voltage end VGL (Voltage Gate Low), and in the case that the first resetting signal XK at a high level is received, enable the high-level maintenance sub-circuit to be electrically connected to the low reference voltage end VGL, so as to reset the output end of the signal maintenance circuit to be at a low level. The first resetting signal XK arrives after the second clock signal at a high level.

To be specific, the high-level maintenance sub-circuit includes three transistors (or TFTs), i.e., a first transistor T1, a second transistor T2 and a third transistor T3. A drain electrode of the T2 is connected to a trigger signal input end of the gate driving unit, a gate electrode of the T1 and a gate electrode of the T2 are connected to the first clock signal input end, a source electrode of the T1 is connected to a drain electrode of the T2 and a drain electrode of the T3 through a node N_1, a source electrode of the T3 is connected to the second clock signal input end, and the node Q connected to a gate electrode of the T3 and a source electrode of the T2 serves as the output end of the signal maintenance circuit. In the embodiments of the present disclosure, through a connection structure consisting of the T1, the T2 and the T3, it is able for the signal maintenance to output a high level from the output end in accordance with the inputted trigger signal at the high level in the case that the first clock signal at a high level is received. In addition, through the connection structure consisting of the T1, the T2 and the T3, it is able to reduce a leakage current, and the reason thereof will be given hereinafter.

The level pull-down sub-circuit is further configured to, in the case that the first clock signal at a high level is received, enable the node Q to be electrically disconnected from the low reference voltage end VGL, and after the reception of the second clock signal at a high level, enable the node Q to be electrically connected to the low reference voltage end VGL, so as to pull down a level at the node Q.

The level pull-down sub-circuit may include four transistors (or Thin Film Transistors (TFTs)), i.e., a tenth transistor T10, an eleventh transistor T11, a twelfth transistor T12, and a thirteenth transistor T13. A gate electrode of the T10, a gate electrode of the T11, a source electrode of the T12 and a drain electrode of the T13 are connected to a node QB, a drain electrode of the T10 and a gate electrode of the T13 are connected to the node Q, a source electrode of the T10 and a drain electrode of the T11 are connected to the drain electrode of the T3, a source electrode of the T11 is connected to the low reference voltage end VGL, a drain electrode of the T12 is connected to a high reference voltage end VGH (Voltage Gate High), and a gate electrode of the T12 is connected to the resetting signal input end so as to receive the first resetting signal XK. Through a connection structure consisting of the T10 and the T11, it is able to reduce the leakage current, and the reason thereof will be given hereinafter.

Figure 5:
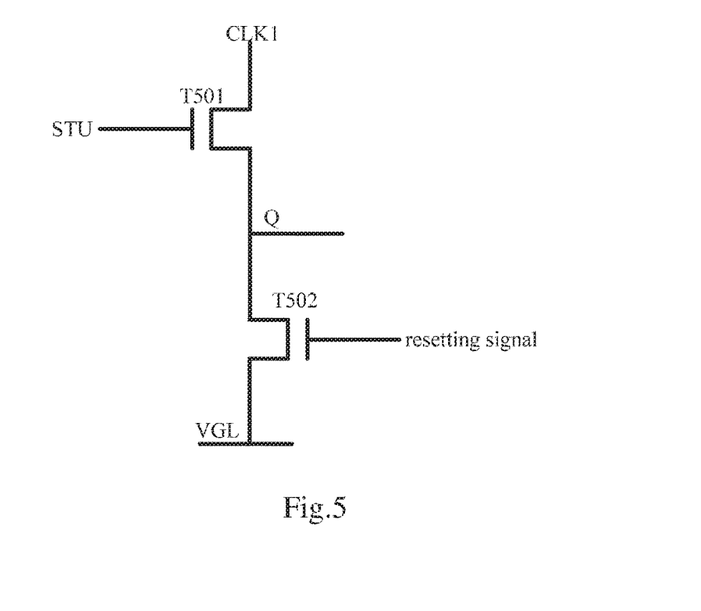
FIG. 5 is a circuit diagram of a signal maintenance circuit according to one embodiment of the present disclosure.

It should be appreciated that, the signal maintenance circuit 201 may also be implemented in any other form, e.g., a simplified circuit structure as shown in FIG. 5 where two transistors (or TFTs) T501 and T502 are included. The T501 may serve as the high-level maintenance sub-circuit configured to output a high level from the output end (i.e., node Q) in accordance with the inputted trigger signal STU at the high level in the case that the first clock signal CLK1 at a high level is received. The T502 may serve as the level pull-down sub-circuit configured to, in the case that the first clock signal at a high level is received (at this time, the resetting signal is at a low level), enable the high-level maintenance sub-circuit to be electrically disconnected from the low reference voltage end VGL, and in the case that the resetting signal at a high level is received after the second clock signal at a high level, enable the high-level maintenance sub-circuit to be electrically connected to the low reference voltage end VGL, so as to reset the output end of the signal maintenance circuit to be at a low level.

As compared with the signal maintenance circuit in FIG. 4, the signal maintenance circuit in FIG. 5 has a simpler circuit structure, but a large leakage current may occur. Experimental results show that, in the case that the signal maintenance circuit in FIG. 4 is adopted, it is able to remarkably reduce the leakage current, thereby to reduce the power consumption.

For the gate driving unit of the circuit as shown in FIG. 4, the first-level output circuit 202 includes a fourth transistor T4, a fifth transistor T5, a sixth transistor T6, a seventh transistor T7, a first capacitor C1 and a second capacitor C2. A gate electrode of the T4 is connected to the trigger signal input end of the first-level output circuit and the node Q, a drain electrode of the T4 is connected to the second clock signal input end, a source electrode of the T4 is connected to a drain electrode of the T5 and a gate electrode of the T6, a node connecting a gate electrode of the T5 and a gate electrode of the T7 serves as the resetting signal input end of the first-level output circuit 202, and is connected to the signal maintenance circuit. More specifically, a resetting signal input end of the first-level output circuit 202 is connected to a QB node in the signal maintenance circuit, a source electrode of the T5 and a source electrode of the T7 are connected to the low reference voltage end VGL, a drain electrode of the T6 is connected to a VDD end (a circuit operating voltage end), the first capacitor C1 is connected to the gate electrode and the source electrode of the T4, the second capacitor C2 is connected to the gate electrode and a source electrode of the T6, and a drain electrode of the T7 and the source electrode of the T6 are connected to a node A serving as the output end OUT1 of the first-level output circuit.

The second-level output circuit 203 includes an eighth transistor T8, a ninth transistor T9, a fourteenth transistor T14, a fifteenth transistor T15, a sixteenth transistor T16 and a third capacitor C3. A gate electrode of the T14 is connected to a gate electrode of the T6, a drain electrode of the T14 is connected to the trigger signal input end of the second-level output circuit and a node A, a source electrode of the T14 is connected to a drain electrode of the T15 and a drain electrode of the T16 through a node N_2, a source electrode of the T15 is connected to a gate electrode of the T8, a drain electrode of the T8 is connected to a VDD end, a source electrode of the T9 and a source electrode of the T16 are connected to the low reference voltage end VGL, a node connecting a gate electrode of the T9 and a gate electrode of the T16 serves as the resetting signal input end of the second-level output circuit 203, is connected to the first clock signal input end, a gate electrode of the T15 is connected to the third clock signal input end, the third capacitor C3 is connected to the gate electrode and a source electrode of the T8, and a node B connecting the source electrode of the T8 and a drain electrode of the T9 serves as the output end OUT2 of the second-level output circuit.

Obviously, the function of the above-mentioned first-level and second-level output circuits, i.e., outputting the driving signals at a high level in accordance with the high level signals in the case that the clock signals at a high level are received, may also be achieved through any other circuits, which also fall within the scope of the present disclosure.

Figure 6:
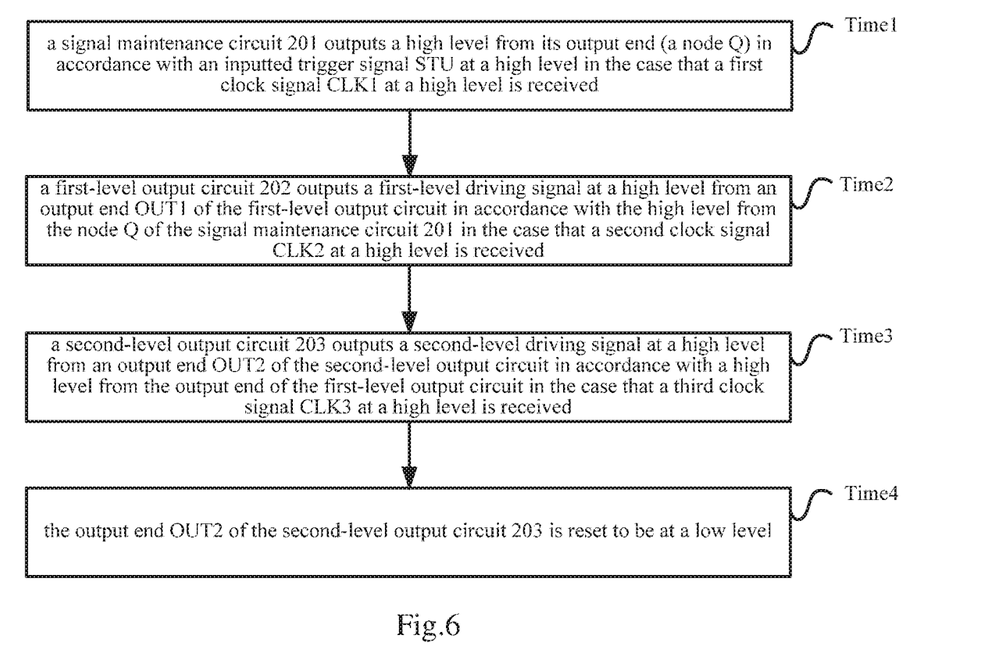
FIG. 6 is a schematic view showing a work flow of circuits of the gate driving unit according to one embodiment of the present disclosure.

A working flow of the gate driving unit may include the following time periods as shown in FIG. 6.

First time period (Time1): the signal maintenance circuit 201 outputs a high level from the output end (i.e., node Q) in accordance with the trigger signal STU at a high level in the case that the first clock signal CLK1 at a high level is received.

To be specific, in the circuit as shown in FIG. 4, the CKL1 and the STU are at a high level, the CLK2, the CLK3 and the XK are at a low level, so as to turn on the T1, the T2 and the T4. The STU is written through the T1 and the T2, so as to pull up a potential at the node Q to a high level. At the same time, T13 is turned on, so as to pull down a potential at the node QB to turn off the T10 and the T11, thereby to enable the node Q to be maintained at a high level.

Second time period (Time2): the first-level output circuit 202 outputs the first-level driving signal at a high level from the output end OUT1 of the first-level output circuit 202 in accordance with the high level from the node Q of the signal maintenance circuit 201 in the case that the second clock signal CLK2 at a high level is received.

To be specific, in the circuit as shown in FIG. 4, the CLK1, the STU and the XK are at a low level, and the CLK2 is at a high level. Because at Time1, the potential at the node Q has been pulled up to be sufficient to turn the T4 on, the CLK2 is applied to a port CA through the T4. Due to a coupling effect of the capacitor C1, the potential at the node Q is pulled up again, so the CLK2 is almost outputted to the port CA in a full-swing manner, i.e., the port CA outputs a high level. The port CA serves as a switch for the gate electrode of the T6, so as to turn on the T6, thereby to output the VDD to a port A, i.e., the output end OUT1 of the first-level output circuit 202, in a full-swing manner, thereby to output the first-level driving signal at a high level through the output end OUT1. Within this time period, the T14 is turned on by the CA, so as to apply a voltage at the node A to the node N_2.

In addition, the reason why the connection structure consisting of the T1, the T2 and the T3 has a small leakage current will be described as follows. Within Time2, the node Q and the CLK2 are both at a high level, and at this time, the T3 is turned on, and the node N_1 is at a high level. A gate-to-source voltage of the T2 is equal to a difference between a voltage of the CLK1 and a voltage at the node N_1, and the CLK1 is at a low level, so the difference between the voltage of the CLK1 and the voltage at the node N_1 is smaller than 0. Hence, T2 may be turned off more thoroughly, and thereby it is able to reduce the leakage current at the node Q.

The reason why the connection structure consisting of the T10 and the T11 can help to reduce the leakage current will be described as follows. Within Time2, the node Q and CLK2 are both at a high level, and at this time, the T3 is turned on and the node N_1 is at a high level. A gate-to-source voltage of the T10 is equal to a difference between a voltage of the node QB and a voltage of the node N_1, and the node QB is at a low level, i.e., so the difference between the voltage of the node QB and the voltage of the node N_1 is smaller than 0. Hence, the T10 may be turned off more thoroughly, and thereby it is able to further reduce the leakage current at the node Q.

Third time period (Time3): the second-level output circuit 203 outputs the second-level driving signal at a high level from the output end OUT2 of the second-level output circuit 203 in accordance with the high level from the output end of the first-level output circuit 202 in the case that the third clock signal CLK3 at a high level is received.

To be specific, in the circuit as shown in FIG. 4, the CLK1, the CLK2 and the STU are each at a low level, and the XK and the CLK3 are each at a high level. Within Time3, T15 is turned on, so as to pull up a voltage applied to the gate electrode of the T8, turn on the T8 and output the VDD to a port B (i.e., the output end OUT2 of the second-level output circuit 203) in a full-swing manner, thereby to output the second-level driving signal at a high level through the output end OUT2. Within this time period, the XK is at a high level, so as to turn on the T12 and pull up the potential at the node QB, thereby to turn on the T5, the T7, the T10 and the T11. In this way, it is able to reset the output end OUT1 of the first-level output circuit 202 and the output end (i.e., the node Q) of the signal maintenance circuit 201 to be at a low level, thereby to reset the output ends of the signal maintenance circuit 201 and the first-level output circuit 202 under the control of the first resetting signal XK.

Fourth time period (Time4): the output end OUT2 of the second-level output circuit 203 is reset to be at a low level.

To be specific, in the circuit as shown in FIG. 4, the STU, the CLK2, CLK3 and the XK are each at a low level, and the CLK1 is at a high level, so as to turn on the T9 and the T16, pull down the potential at the output end OUT2 of the second-level output circuit 203 and reset the output end OUT2 to be at a low level. In this way, it is able to reset the output end of the second-level output circuit 203 under the control of the first clock signal.

FIG. 3 shows a sequence of the clock signals and the input/output signals within the time periods. As shown in FIG. 3, the first, second and third clock signals have a substantially identical clock cycle M and a duty ratio of approximately 1:2. The first resetting signal XK is maintained at a low level within a first high-level period of the first clock signal CLK1 and within a first high-level period of the second clock signal CLK2 after the trigger signal at a high level has been received, and then jumped between a high level and a low level on approximately two-thirds of one clock cycle. It is appreciated that the above clock cycles and the above duty ratios of the first, second and third clock signals, and the above jumping cycle of the first resetting signal shown in FIG. 3 are for illustration purpose only, and the present disclosure is not limited thereto; a person skilled in the art understands that other clock cycles and other duty ratios of the first, second and third clock signals, and another jumping cycle of the first resetting signal are possible under the teaching of the present disclosure, which shall also fall within the scope of the present disclosure.

Figure 7:
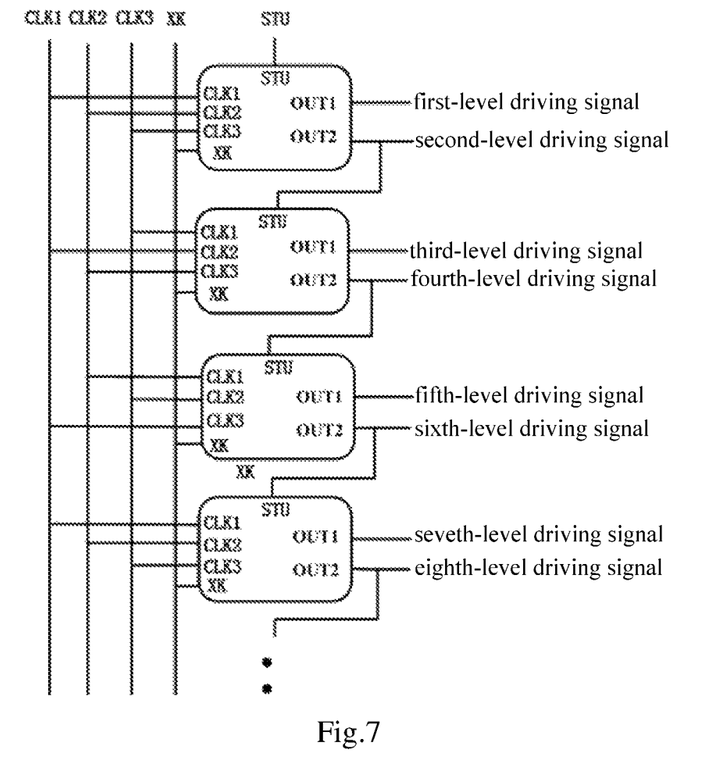
FIG. 7 is a schematic view showing a plurality of gate driving units connected in a cascaded manner according to one embodiment of the present disclosure.
Figure 8:
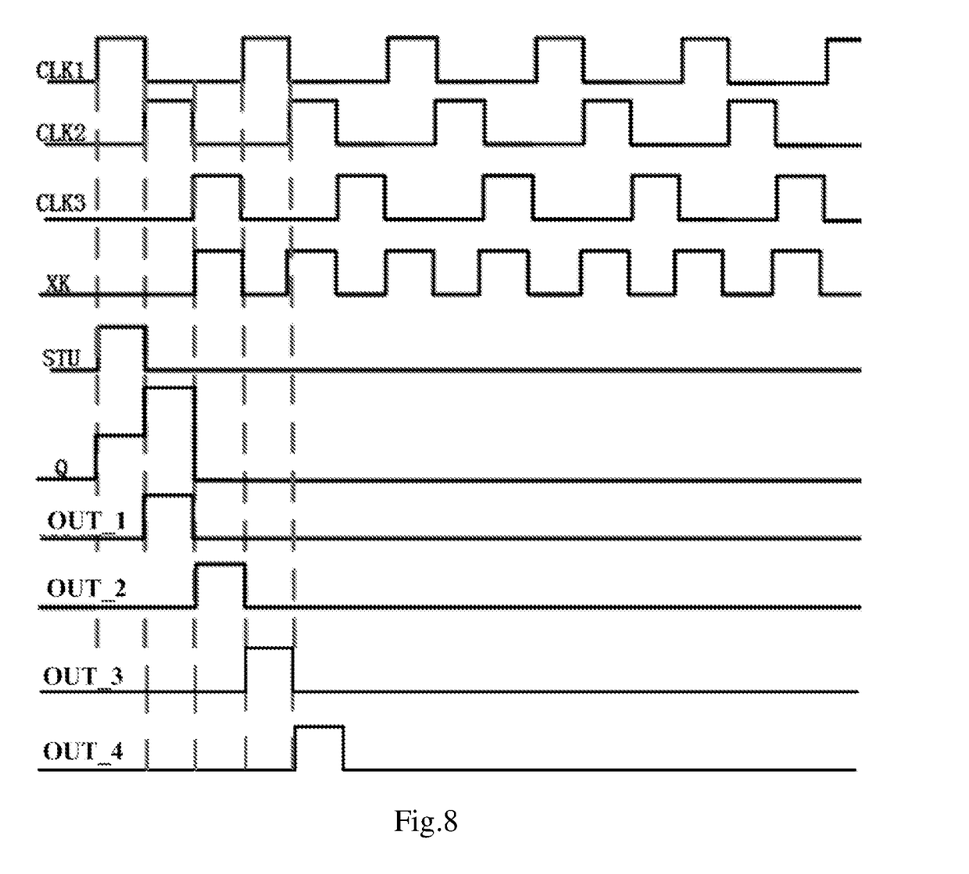
FIG. 8 is a sequence diagram of a gate driving circuit according to one embodiment of the present disclosure.

The present disclosure further provides in some embodiments a gate driving circuit which, as shown in FIG. 7, includes at least two of the above-mentioned gate driving units connected in a cascaded manner. Among these gate driving units, a second-level driving signal from a current-level gate driving unit serves as an inputted trigger signal for a signal maintenance circuit of a next-level gate driving unit. For example, an output end OUT2 of a first-level gate driving unit is connected to a trigger signal input end of a signal maintenance circuit of a second-level gate driving unit, and an output end OUT2 of a second-level gate driving unit is connected to a trigger signal input end of a signal maintenance circuit of a third-level gate driving unit, . . . , and an output end OUT2 of an $n^{th}$-level gate driving unit is connected to a trigger signal input end of a signal maintenance circuit of an $(n+1)^{th}$-level gate driving unit, where n is a natural number greater than 1 and smaller than N, and N represents the total number of the gate driving units in the gate driving circuit. The $n^{th}$-level gate driving unit outputs a $(2n-1)^{th}$-level driving signal and an $(2n)^{th}$-level driving signal. FIG. 8 is a sequence diagram of the clock signals and the output signals of the first-level gate driving unit and the second-level gate driving unit connected in a cascaded manner, where the OUT_1 and the OUT_2 represent the two driving signals from the first-level gate driving unit respectively, and the OUT_3 and the OUT_4 represent the two driving signals from the second-level gate driving unit respectively.

The cascaded gate driving units of the gate driving circuit may share the clock signals and the first resetting signal. In other words, the first clock signal input ends of the gate driving units may be connected to an identical first clock signal line, the second clock signal input ends of the gate driving units may be connected to an identical second clock signal line, the third clock signal input ends of the gate driving units may be connected to an identical third clock signal line, and the resetting signal input ends of the gate driving units may be connected to an identical first resetting signal line.

Each gate driving unit may output two driving signals, so it is able to reduce by half the number of the gate driving units in the case that an identical number of driving signals need to be provided, thereby to facilitate the miniaturization and low cost of the gate driving circuit and the display device.

As can be seen from the cascaded circuit in FIG. 7, the cascading relationship and the wiring among the gate driving units are very simple, i.e., it is merely necessary to connect the output end OUT2 of the current-level gate driving unit to the trigger signal input end of the next-level gate driving unit. As a result, it is able to remarkably save the wiring space, thereby to further facilitate the miniaturization and low cost of the gate driving circuit and the display device.

According to the embodiments of the present disclosure, the signal maintenance circuit arranged in front of the first-level output circuit may output a driving signal at a high level in accordance with the trigger signal in the case that the first clock signal at a high level is received, maintain the driving signal and output it to the first-level output circuit in the case that the second clock signal at a high level is received. Two output circuits connected in a cascaded manner, i.e., the first-level output circuit and the second-level output circuit, may output driving signals at a high level respectively in the case that the second clock signal and the third clock signal each at a high level are received. In this way, it is able to trigger two gate driving signals through one trigger signal. As a result, it is able to reduce the number of the gate driving units in the gate driving circuit and the display device in the case that an identical number of rows of pixels need to be driven.

In addition, the driving signal from the first-level output circuit is delayed by one clock signal with respect to the trigger signal, and the driving signal from the second-level output circuit is delayed by one clock signal with respect to the driving signal from the first-level output circuit. Hence, in the case that the gate driving units are connected in a cascaded manner, the driving signal from the second-level output circuit may be used as a trigger signal for the next-level gate driving unit. The cascading relationship thereof and the wiring between the cascaded gate driving units are very simple, so it is able to save the wiring space in a gate driving circuit board, thereby to facilitate the miniaturization and low cost of the display device.

It should be appreciated that, the steps, measures or solutions in the operations, methods or processes that have been described hereinabove may be substituted, altered, combined or deleted. Further, the other steps, measures or solutions in the operations, methods or processes that have been described hereinabove may also be substituted, altered, rearranged, decomposed, combined or deleted. Moreover, the steps, measures or solutions in the operations, methods or processes in the related art similar to those mentioned in the present disclosure may also be substituted, altered, rearranged, decomposed, combined or deleted.

A person skilled in the art may understand that, the above are merely the preferred embodiments of the present disclosure, but the present disclosure is not limited thereto. Under the teaching of the present disclose, the technical features in the above embodiments or other embodiments may be combined, and the steps in the above embodiments or other embodiments may be executed in any appropriate order, many other changes as described above are also possible, and the details thereof are omitted herein to not obscure the principle of the present disclosure. Obviously, a person skilled in the art may make further modifications and improvements without departing from the spirit of the present disclosure, and these modifications and improvements shall also fall within the scope of the present disclosure.

What is claimed is:

1. A gate driving unit, comprising:
   a signal maintenance circuit which is configured to, during a period that a first clock signal input end of the signal maintenance circuit receives a first clock signal at a high level, output a high level from an output end of the signal maintenance circuit in accordance with a trigger signal at a high level inputted into a trigger signal input end of the signal maintenance circuit;
   a first-level output circuit, wherein a trigger signal input end of the first-level output circuit is connected to the output end of the signal maintenance circuit, and the first-level output circuit is configured to, during a period that a second clock signal input end of first-level output circuit receives a second clock signal at a high level, output a first-level driving signal at a high level from an output end of the first-level output circuit in accordance with the high level from the output end of the signal maintenance circuit; and a second-level output circuit, wherein a trigger signal input end of the second-level output circuit is connected to the output end of the first-level output circuit, and the second-level output circuit is configured to, during a period that a third clock signal input end of the second-level output circuit receives a third clock signal at a high level, output a second-level driving signal at a high level from an output end of the second-level output circuit in accordance with the high level from the output end of the first-level output circuit, wherein the second clock signal at the high level arrives upon the first clock signal at the high level ending, and the third clock signal at the high level arrives upon the second clock signal at the high level ending;

wherein each of the first-level output circuit and the second-level output circuit further comprises a respective resetting signal input end and is configured to, when the respective resetting signal input end receives a resetting signal, reset the respective output end to be at a low level;

wherein the resetting signal input end of the first-level output circuit is connected directly to the signal maintenance circuit, and the output end of the first-level output circuit is being reset under the control of a first resetting signal; and wherein the resetting signal input end of the second-level output circuit receives a second resetting signal, and the second resetting signal is the first clock signal.

2. The gate driving unit according to claim 1, wherein:
the signal maintenance circuit further comprises a resetting signal input end and is configured to, when the resetting signal input end of the signal maintenance circuit receives a resetting signal, reset the respective output end to be at a low level.

3. The gate driving unit according to claim 2, wherein:
the resetting signal input end of the signal maintenance circuit receives the resetting signal, and the signal maintenance circuit is configured to reset the output end of the signal maintenance circuit in accordance with the resetting signal.

4. The gate driving unit according to claim 3, wherein:
the signal maintenance circuit comprises a high-level maintenance sub-circuit and a level pull-down sub-circuit;

the high-level maintenance sub-circuit is configured to, during the period that the first clock signal is at the high level, output the high level from the output end of the signal maintenance circuit in accordance with the inputted trigger signal at the high level;

the level pull-down sub-circuit is configured to, during the period that the first clock signal is at the high level, enable the high-level maintenance sub-circuit to be electrically disconnected from a low reference voltage end, and upon the resetting signal at the high level arriving, enable the high-level maintenance sub-circuit to be electrically connected to the low reference voltage end, to reset the output end of the signal maintenance circuit to be at a low level; and the resetting signal arrives upon the second clock signal at the high level ends.

5. The gate driving unit according to claim 4, wherein:
the high-level maintenance sub-circuit comprises a first transistor, a second transistor and a third transistor;

a drain electrode of the first transistor is connected to a trigger signal input end of the gate driving unit, a gate electrode of the first transistor and a gate electrode of the second transistor are connected to the first clock signal input end, a source electrode of the first transistor is connected to a drain electrode of the second transistor and a drain electrode of the third transistor, a source electrode of the third transistor is connected to the second clock signal input end, and a first node connecting a gate electrode of the third transistor and a source electrode of the second transistor serves as the output end of the signal maintenance circuit; and the level pull-down sub-circuit is further configured to, during the period that the first clock signal is at the high level, enable the first node to be electrically disconnected from the low reference voltage end, and upon the second clock signal at the high level ending, enable the first node to be electrically connected to the low reference voltage end, to pull down a level at the first node.

6. The gate driving unit according to claim 5, wherein:
the level pull-down sub-circuit comprises a tenth transistor, an eleventh transistor, a twelfth transistor, and a thirteenth transistor; and a gate electrode of the tenth transistor, a gate electrode of the eleventh transistor, a source electrode of the twelfth transistor and a drain electrode of the thirteenth transistor are connected to a second node, a drain electrode of the tenth transistor and a gate electrode of the thirteenth transistor are connected to the first node, a source electrode of the tenth transistor and a drain electrode of the eleventh transistor are connected to the drain electrode of the third transistor, a source electrode of the eleventh transistor is connected to the low reference voltage end, a drain electrode of the twelfth transistor is connected to a high reference voltage end, and a gate electrode of the twelfth transistor is connected to the resetting signal input end of the signal maintenance circuit.

7. The gate driving unit according to claim 6, wherein:
the first-level output circuit comprises a fourth transistor, a fifth transistor, a sixth transistor, a seventh transistor, a first capacitor and a second capacitor; and a gate electrode of the fourth transistor is connected to the trigger signal input end of the first-level output circuit and the first node, a drain electrode of the fourth transistor is connected to the second clock signal input end, a source electrode of the fourth transistor is connected to a drain electrode of the fifth transistor and a gate electrode of the sixth transistor, a node connecting a gate electrode of the fifth transistor and a gate electrode of the seventh transistor is connected to the second node and serves as the resetting signal input end of the first-level output circuit, a source electrode of the fifth transistor and a source electrode of the seventh transistor are connected to the low reference voltage end, a drain electrode of the sixth transistor is connected to a circuit operating voltage end, the first capacitor is connected to the gate electrode and the source electrode of the fourth transistor, the second capacitor is connected to the gate electrode and a source electrode of the sixth transistor, and a third node connecting a drain electrode of the seventh transistor and the source electrode of the sixth transistor serves as the output end of the first-level output circuit.

8. The gate driving unit according to claim 7, wherein:
the second-level output circuit comprises an eighth transistor, a ninth transistor, a fourteenth transistor, a fifteenth transistor, a sixteenth transistor and a third capacitor; and
a gate electrode of the fourteenth transistor is connected to a gate electrode of the sixth transistor, a drain electrode of the fourteenth transistor is connected to the trigger signal input end of the second-level output circuit and the third node, a source electrode of the fourteenth transistor is connected to a drain electrode of the fifteenth transistor and a drain electrode of the sixteenth transistor, a source electrode of the fifteenth transistor is connected to a gate electrode of the eighth transistor, a drain electrode of the eighth transistor is connected to the circuit operating voltage end, a source electrode of the ninth transistor and a source electrode of the sixteenth transistor are connected to the low reference voltage end, a node connecting a gate electrode of the ninth transistor and a gate electrode of the sixteenth transistor is connected to the first clock signal input end and serves as the resetting signal input end of the second-level output circuit, a gate electrode of the fifteenth transistor is connected to the third clock signal input end, the third capacitor is connected to the gate electrode and a source electrode of the eighth transistor, and a fourth node connecting the source electrode of the eighth transistor and a drain electrode of the ninth transistor serves as the output end of the second-level output circuit.

9. The gate driving unit according to claim 1, wherein the first, second and third clock signals have a substantially identical clock cycle, and a duty ratio of approximately 1:2.

10. The gate driving unit according to claim 3, wherein:
the resetting signal is maintained at a low level within a first high-level period of the first clock signal and within a first high-level period of the second clock signal after the trigger signal at the high level has been received, and then jumped between a high level and a low level on approximately two-thirds of one clock cycle.

11. A gate driving circuit, comprising at least two gate driving units each according to claim 1 connected in a cascaded manner,
wherein the second-level driving signal outputted from a current-level gate driving unit serves as the trigger signal inputted to the signal maintenance circuit of a next-level gate driving unit.

12. The gate driving circuit according to claim 11, wherein, for each of the at least two gate driving units:
the signal maintenance circuit, further comprises a resetting signal input end and is configured to, when the resetting signal input end of the signal maintenance circuit receives a resetting signal, reset the respective output end to be at a low level.

13. The gate driving circuit according to claim 12, wherein, for each of the at least two gate driving units:
the resetting signal input end of the signal maintenance circuit receives the resetting signal, and the signal maintenance circuit is configured to reset the output end of the signal maintenance circuit in accordance with the resetting signal.

14. The gate driving circuit according to claim 13, wherein, for each of the at least two gate driving units:

the signal maintenance circuit comprises a high-level maintenance sub-circuit and a level pull-down sub-circuit;
the high-level maintenance sub-circuit is configured to, during the period that the first clock signal is at the high level, output the high level from the output end of the signal maintenance circuit in accordance with the inputted trigger signal at the high level;
the level pull-down sub-circuit is configured to, during the period that the first clock signal is at the high level, enable the high-level maintenance sub-circuit to be electrically disconnected from a low reference voltage end, and upon the resetting signal at the high level arriving, enable the high-level maintenance sub-circuit to be electrically connected to the low reference voltage end, to reset the output end of the signal maintenance circuit to be at a low level; and
the resetting signal arrives upon the second clock signal at the high level ending.

15. The gate driving circuit according to claim 14, wherein, for each of the at least two gate driving units:
the high-level maintenance sub-circuit comprises a first transistor, a second transistor and a third transistor;
a drain electrode of the first transistor is connected to a trigger signal input end of the gate driving unit, a gate electrode of the first transistor and a gate electrode of the second transistor are connected to the first clock signal input end, a source electrode of the first transistor is connected to a drain electrode of the second transistor and a drain electrode of the third transistor, a source electrode of the third transistor is connected to the second clock signal input end, and a first node connecting a gate electrode of the third transistor and a source electrode of the second transistor serves as the output end of the signal maintenance circuit; and
the level pull-down sub-circuit is further configured to, during the period that the first clock signal is at the high level, enable the first node to be electrically disconnected from the low reference voltage end, and upon the second clock signal at the high level ending, enable the first node to be electrically connected to the low reference voltage end, to pull down a level at the first node.

16. The gate driving circuit according to claim 15, wherein, for each of the at least two gate driving units:
the level pull-down sub-circuit comprises a tenth transistor, an eleventh transistor, a twelfth transistor, and a thirteenth transistor; and
a gate electrode of the tenth transistor, a gate electrode of the eleventh transistor, a source electrode of the twelfth transistor and a drain electrode of the thirteenth transistor are connected to a second node, a drain electrode of the tenth transistor and a gate electrode of the thirteenth transistor are connected to the first node, a source electrode of the tenth transistor and a drain electrode of the eleventh transistor are connected to the drain electrode of the third transistor, a source electrode of the eleventh transistor is connected to the low reference voltage end, a drain electrode of the twelfth transistor is connected to a high reference voltage end, and a gate electrode of the twelfth transistor is connected to the resetting signal input end of the signal maintenance circuit.

17. The gate driving circuit according to claim 16, wherein, for each of the at least two gate driving units:

the first-level output circuit comprises a fourth transistor, a fifth transistor, a sixth transistor, a seventh transistor, a first capacitor and a second capacitor; and a gate electrode of the fourth transistor is connected to the trigger signal input end of the first-level output circuit and the first node, a drain electrode of the fourth transistor is connected to the second clock signal input end, a source electrode of the fourth transistor is connected to a drain electrode of the fifth transistor and a gate electrode of the sixth transistor, a node connecting a gate electrode of the fifth transistor and a gate electrode of the seventh transistor is connected to the second node and serves as the resetting signal input end of the first-level output circuit, a source electrode of the fifth transistor and a source electrode of the seventh transistor are connected to the low reference voltage end, a drain electrode of the sixth transistor is connected to a circuit operating voltage end, the first capacitor is connected to the gate electrode and the source electrode of the fourth transistor, the second capacitor is connected to the gate electrode and a source electrode of the sixth transistor, and a third node connecting a drain electrode of the seventh transistor and the source electrode of the sixth transistor serves as the output end of the first-level output circuit.

18. The gate driving circuit according to claim 17, wherein, for each of the at least two gate driving units:

the second-level output circuit comprises an eighth transistor, a ninth transistor, a fourteenth transistor, a fifteenth transistor, a sixteenth transistor and a third capacitor; and a gate electrode of the fourteenth transistor is connected to a gate electrode of the sixth transistor, a drain electrode of the fourteenth transistor is connected to the trigger signal input end of the second-level output circuit and the third node, a source electrode of the fourteenth transistor is connected to a drain electrode of the fifteenth transistor and a drain electrode of the sixteenth transistor, a source electrode of the fifteenth transistor is connected to a gate electrode of the eighth transistor, a drain electrode of the eighth transistor is connected to the circuit operating voltage end, a source electrode of the ninth transistor and a source electrode of the sixteenth transistor are connected to the low reference voltage end, a node connecting a gate electrode of the ninth transistor and a gate electrode of the sixteenth transistor is connected to the first clock signal input end and serves as the resetting signal input end of the second-level output circuit, a gate electrode of the fifteenth transistor is connected to the third clock signal input end, the third capacitor is connected to the gate electrode and a source electrode of the eighth transistor, and a fourth node connecting the source electrode of the eighth transistor and a drain electrode of the ninth transistor serves as the output end of the second-level output circuit.

19. The gate driving circuit according to claim 11, wherein the first, second and third clock signals have a substantially identical clock cycle, and a duty ratio of approximately 1:2.

20. A display device, comprising the gate driving circuit according to claim 11.

* * * * *